United States Patent [19]
Umehara et al.

[11] Patent Number: 6,118,183
[45] Date of Patent: Sep. 12, 2000

[54] SEMICONDUCTOR DEVICE, MANUFACTURING METHOD THEREOF, AND INSULATING SUBSTRATE FOR SAME

[75] Inventors: Norito Umehara, Oita; Masazumi Amagai, Beppu, both of Japan

[73] Assignee: Texas Instruments Incorporated, Dallas, Tex.

[21] Appl. No.: 08/990,481

[22] Filed: Dec. 15, 1997

[30] Foreign Application Priority Data

Dec. 19, 1996 [JP] Japan .................................. 8-354427

[51] Int. Cl.[7] ........................... H01L 23/48; H01L 23/52; H01L 29/40
[52] U.S. Cl. ............................. 257/783; 257/782
[58] Field of Search ..................... 257/780, 781, 257/783, 782, 778

[56] References Cited

U.S. PATENT DOCUMENTS

| | | |
|---|---|---|
| 5,757,078 | 5/1998 | Matsuda et al. . |
| 5,801,446 | 9/1998 | DiStefano et al. . |
| 5,844,320 | 12/1998 | Ono et al. . |
| 5,866,951 | 2/1999 | Gademann et al. . |
| 5,892,288 | 4/1999 | Muraki et al. . |
| 5,905,303 | 5/1999 | Kata et al. . |

*Primary Examiner*—Sheila V. Clark
*Attorney, Agent, or Firm*—Gerald E. Laws; W. James Brady, III; Frederick J. Telecky, Jr.

[57] ABSTRACT

To provide a type of semiconductor device with high resistance to cracks and having fewer manufacturing steps. Semiconductor device 1 has a substrate having insulating base material 2 mainly made of a thermoplastic polyimide resin. When heated to a temperature above the glass transition temperature, the surface of insulating base material 2 made of thermoplastic polyimide resin melts and exhibits the properties of an adhesive. The adhesive layer is preferred for laminating the metal film for forming conductor pattern 3, and it is preferred for fixing semiconductor IC chip 4 to insulating base material 2 made of thermoplastic polyimide resin. When semiconductor IC chip 4 is fixed on insulating base material 2 made of thermoplastic polyimide resin, the two are brought into contact with each other under a prescribed pressure, and the atmospheric temperature is higher than the glass transition temperature for bonding. Frame 6 made up of a metal lead frame is arranged on the periphery of the insulating base material for reinforcing insulating base material 2 made of thermoplastic polyimide resin.

16 Claims, 10 Drawing Sheets where,
 X and Y represent O or C=O
 a and b meet the relationship $0.07 \leq b/(a+b) \leq 0.7$
 R1, R2: bivalent C1-5 aliphatic group or C-6 or higher aromatic group
 R3, R4: monovalent aliphatic group or aromatic group
 n = 1-13

SEMICONDUCTOR DEVICE, MANUFACTURING METHOD THEREOF, AND INSULATING SUBSTRATE FOR SAME

FIELD OF THE INVENTION

The present invention pertains to a type of semiconductor device having a semiconductor IC chip carried on a flexible insulating substrate, and its manufacturing method. In particular, the present invention can be applied preferably to a CSP (Chip Size Package) type semiconductor device.

BACKGROUND OF THE INVENTION

With progress in miniaturization and the increase in operating speed of electronic information equipment, rapid progress has been achieved in reducing the size and increasing the number of pins of semiconductor IC packages. From the viewpoint of high-density assembly, it is believed that the so-called bare chip assembly, an assembly method that omits the package, might prove to be the optimal assembly method. However, due to problems related to reliability and assembly, this method has not yet been widely adopted in general home appliances. In particular, extensive studies and development are being carried out on the CSP (Chip Size Package). CSP is a type of high-density package in which the density is increased so that the size of the IC package becomes similar to or only slightly larger than the chip size.

FIG. 11 is a diagram illustrating an example of the conventional CSP type package. On flexible insulating substrate (2) on which copper pattern (3) has been formed, semiconductor IC chip (4) is carried on flexible insulating substrate (2). Said flexible insulating substrate (2) may be made of condensed type (nonthermoplastic) polyimide resin, such as films of Upilex [transliteration] (trade names) and Kapton (trade name). In order to realize insulation between chip (4) and conductor pattern (3), epoxy-based solder resist (26) is applied to the surface of insulating base material (2), so as to form substrate A. By means of insulating epoxy-based die-attaching material (27), chip (4) is bonded on substrate D. After wire bonding, the chip is molded, and solder balls (5) are moved to the lower surface of substrate D, forming CSP type package.

However, the aforementioned package with the conventional structure has the following disadvantages:

(1) The glass transition temperature Tg of the epoxy base die-attaching material for fixing the chip is in the range of about −10 to 150° C. In the case of high-temperature reflow at temperature higher than 200° C. for forming the solder bumps, the bonding strength decreases. As a result, it becomes impossible to maintain the bonding between the substrate and chip during reflow, and cracks form on the package.

(2) The adhesion between the molding material for sealing the chip and the epoxy-based solder resist coated on the substrate is relatively low (with a shear strength in the range of about 70–200 kg/mm2), and in the case of reflow, separation takes place between the molding material and the solder resist on the periphery of the package.

(3) In the manufacturing operation of the package, two methods may be adopted to form the conductor pattern on the flexible insulating base material. In one of these methods, after the epoxy-based adhesive is coated on the surface of the insulating base material (adhesive layer (28) in FIG. 11), a copper foil is laminated and it is then etched to form the conductor pattern. In the other method, after a copper film pattern is formed on the insulating base material by sputtering or electrolytic plating, the conductor pattern is formed by means of electrolytic plating. However, for the former, after the copper foil is laminated, curing must be performed at about 170° C. for about 1 h. In this case, the gs from the adhesive may contaminate the copper foil. The cleaning operation of the copper foil by means of plasma cleaning leads to an increase in the number of manufacturing steps of the package, and the cost of the package is increased. In the latter case, for formation of the copper film pattern by means of sputtering or electrolytic plating, the productivity is poor, and the cost of the package is increased.

(4) In the high-density assembly operation, a laminated substrate having multiple layers of the conductor pattern in the thickness direction of the substrate is highly demanded. For the conventional condensed type polyimide substrate, an adhesive is needed to bond the various layers of insulating base material to each other. This, however, increases the number of the manufacturing steps of the laminated substrate and increases the cost.

(5) When the chip is assembled, in some cases, the amount of the epoxy-based die-attaching material for fixing the chip to the substrate may be insufficient to cover the entire lower surface of the chip. In such cases, the molding material enters the gap between the chip and the substrate in the resin molding operation; due to the difference between the die-attaching material and the molding material with respect to the linear expansion coefficient and the tensile modulus, separation of the interface between the die-attaching material and the molding material takes place. In the case of a rapid change in temperature, due to the aforementioned separation, the copper pattern becomes stressed, and the copper pattern may be broken. On the other hand, when the amount of the die-attaching material is too large, the die-attaching material flows to and covers the region of the conductor pattern where wire bonding is needed. Consequently, in assembly of the chip, it is necessary to control the amount of the aforementioned die-attaching material precisely.

(6) Due to the difference in the linear expansion coefficients between the insulating base material made of condensation type polyimide resin and the epoxy-based solder resist coated on the insulating base material, warping occurs, leading to a decrease in the productivity of the package.

The purpose of the present invention is to enable assembly of the aforementioned semiconductor IC chip on a substrate without using the aforementioned epoxy-based die-attaching material, so that the aforementioned problems which accompany the use of epoxy-based die-attaching material can be avoided.

Another purpose of the present invention is to get rid of the aforementioned solder resist so as to realize insulation between the chip and the substrate, and to solve the aforementioned problems that used to take place between the solder resist and substrate or molding material.

Yet another purpose of the present invention is to provide a method in which a conductor pattern can be formed on the substrate for assembly of chip in a process with fewer steps and at a lower cost.

Yet another purpose of the present invention is to realize a laminated substrate used in the semiconductor device without using the conventional adhesive.

SUMMARY OF THE INVENTION

The semiconductor device of the present invention has a substrate having an insulating base material mainly made of a thermoplastic polyimide resin. For the insulating base material made of the thermoplastic polyimide resin, when the temperature is higher than its glass transition temperature, the surface of the insulating base material is melted to exhibit adhesive properties. This adhesive layer is preferable for laminating a metal film for forming the conductor pattern, and it is also preferable for fixing the semiconductor IC chip to the insulating base material. Also, it is preferred for bonding the insulating base material layers made of thermoplastic polyimide resin to each other in order to form a laminated insulating substrate. When the aforementioned semiconductor IC chip is fixed to the substrate, the insulating substrate made of thermoplastic polyimide resin and the chip are brought in contact under a prescribed pressure, and bonding is performed at a temperature in atmosphere higher than the glass transition temperature.

For the aforementioned insulating base material, as long as the aforementioned adhesive characteristics are not lost and silicon modification or fluorine modification of the thermoplastic polyimide resin is performed, it is possible to blend the epoxy-based polymer.

When the semiconductor IC chip is fixed to the surface where the conductor pattern of the aforementioned insulating substrate is formed, it is preferred that a film mainly made of thermoplastic polyimide resin be coated on the surface where the semiconductor IC chip is assembled. This film can further improve adhesion with the substrate, and at the same time, it can function as an insulating layer between the chip and the conductor pattern.

The aforementioned substrate having the insulating base material mainly made of the thermoplastic polyimide resin is flexible. Consequently, it is preferable for use of CSP type package with a structure having the size of the substrate similar to the size of the semiconductor IC chip. Of course, the present invention can also be widely applied in other types of packages, such as BGA (Ball Grid Array) package, QFP (Quad Flat Package) package, etc.

According to the present invention, for reinforcing the substrate having an insulating base material mainly made of a thermoplastic polyimide resin, a reinforcing frame made of metal lead frame can be arranged on the periphery of the insulating base material. However, if the aforementioned measure is taken to improve the strength of the substrate, there is no necessity to use the aforementioned frame. It is preferred that the aforementioned lead frame as the reinforcing frame be fed in the various steps for manufacturing multiple substrates and IC chips. Compared with the case when the aforementioned substrate is fed as TAB tape, the amount of the thermoplastic polyimide resin can be minimized, and the overall cost of the package can be reduced.

The aforementioned substrate having insulating base material mainly made of the thermoplastic polyimide resin can be used in the semiconductor device having a structure in which the electrode pad formed on the principal surface of the semiconductor IC chip and the conductor leads on the substrate are connected to each other by wire bonding, with the principal surface side of the semiconductor IC chip facing up. In the semiconductor device with this structure, resin or another packaging material is used to cover the entire chip. Also, the principal surface of the semiconductor IC chip refers to the surface on which the electrode pad is arranged. Usually, the circuit elements are formed on that surface.

The substrate having an insulating base material mainly made of thermoplastic polyimide resin can also be used in the semiconductor device having a structure of assembly of the semiconductor IC chip using the so-called flip chip method, in which the principal surface side of the semiconductor IC chip is set as the lower side. In this case, on the electrode pad of the principal surface of the chip, bumps mainly made of electroconductive polymer are formed, and it is possible to have the bumps in contact with the conductor pattern. In the step in which the chip is bonded to the substrate, the bumps are also melted so that bonding to the conductor pattern can be realized.

Figure 1:
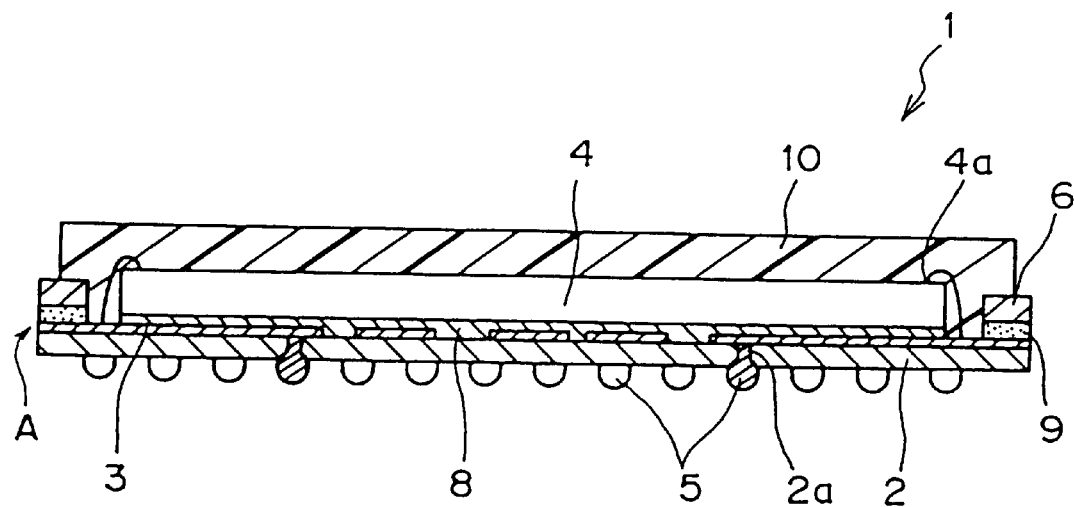
FIG. 1 is a cross-sectional view illustrating the first embodiment of the semiconductor device having the CSP package of the present invention.

REFERENCE NUMERALS AND SYMBOLS AS SHOWN IN THE DRAWINGS 1 represents a semiconductor device, 2 an insulating base material, 2a a through-hole, 3 a copper pattern, 3a a bonding pattern, 3b a solder ball bonding portion, 4 an IC chip, 4a an electrode pad, 5 a solder ball, 6 a reinforcing frame, 7 a lead frame, 8 a film, 9 an adhesive, 10 a resin, 11a a thermoplastic polymide film, 12 a copper foil, 13 a resist, 14 a resist, 15 a solder resist, 16 a resist, 17 a through-hole, 18 a resist, 19 a bump, 20 a gold plating, 21 an oxide film, 22 a passivation layer, 23 a resist, 24 a thermocompression bonding tool, 25 a heat-resistant film, A, B, C, D a substrate.

DESCRIPTION OF EMBODIMENTS

Figure 3:
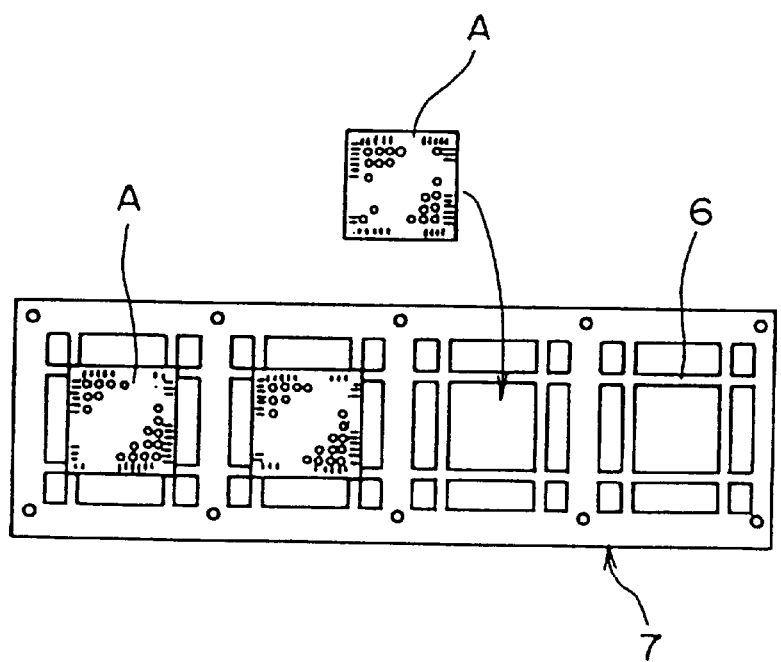
FIG. 3 is a plan view of the lead frame that carries an insulating substrate.
Figure 2:
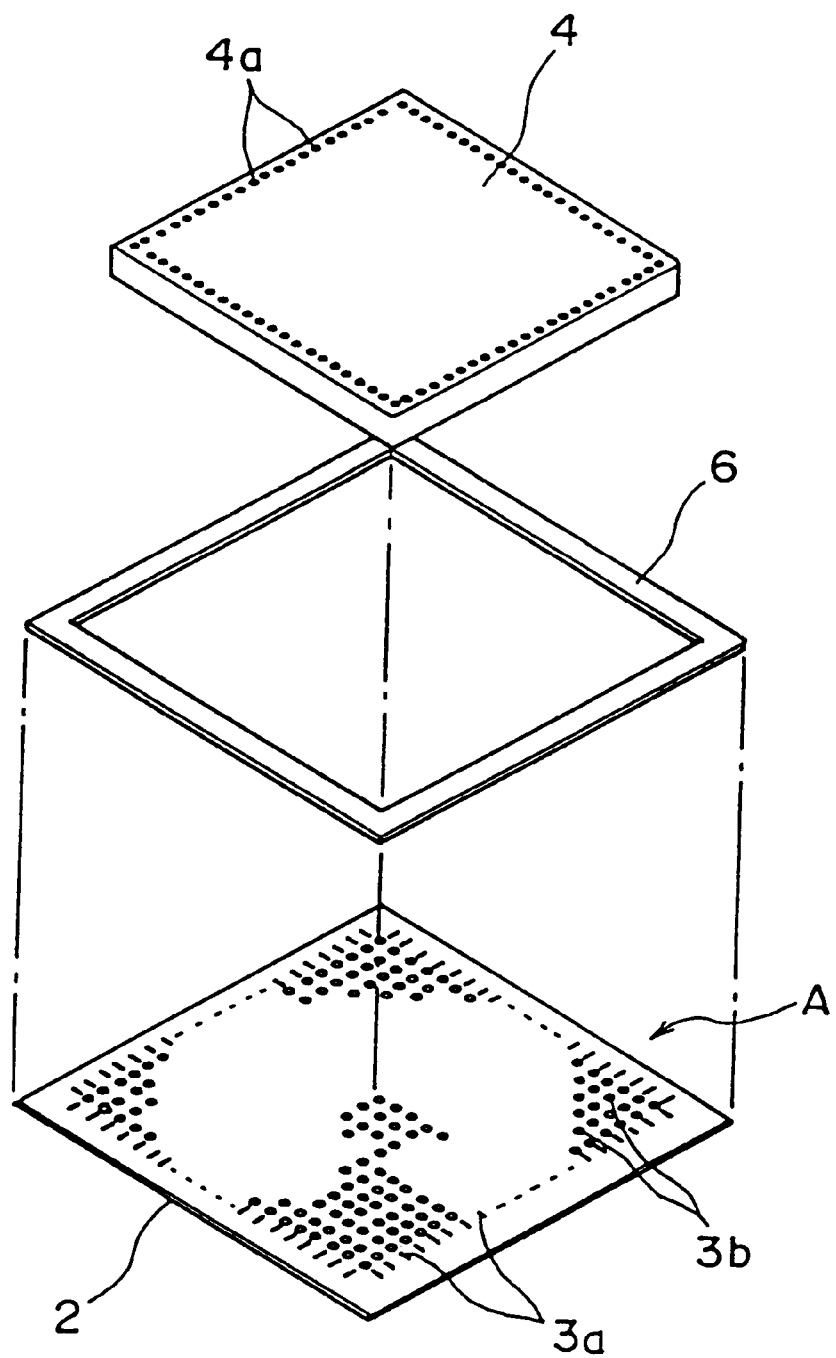
FIG. 2 is an exploded oblique view of the semiconductor device in FIG. 1.

In the following, an embodiment of the present invention will be explained with reference to the figures. FIGS. 1–3 illustrate the first embodiment of the present invention applied in a CSP type package semiconductor device. Semiconductor device (1) has film-like insulating base material (2) made of thermoplastic polyimide resin. Said insulating base material (2) has a larger external size than that of semiconductor IC chip (4) assembled on it. On one side of insulating base material (2), copper pattern (3) is formed so as to form substrate A. As shown schematically in FIG. 2, one end of each copper pattern (3) on insulating base material (2) is bonding pattern (3a) arranged along the circumference of the insulating base material. The other end of each copper pattern (3) is circular solder ball bonding portion (3b). The solder ball bonding portions are arranged in a two-dimensional configuration on the insulating base material. On insulating substrate (2), through-hole (2a) is formed corresponding to the position of each solder ball bonding portion (3b). Solder balls (5) are bonded via through-holes (2a), on solder ball bonding portions (3b).

With the purpose of reinforcing the insulating substrate made of thermoplastic polyimide resin, which tends to deform and break, reinforcing frame (6) is arranged on the periphery of substrate A. As shown in FIG. 3, reinforcing frame (6) is a frame made of metal in the form of a lead frame. In the manufacturing operation, at the position of reinforcing frame (6) on lead frame (7), substrate A is bonded by means of epoxy resin or another insulating adhesive (9). An advantage of use of reinforcing frame (6) is that in addition to reinforcement of the insulating substrate, the manufacturing cost of the package can be cut. When the aforementioned insulating base material is fed in the form of a conventional TAB tape, the portion except what is used as the substrate must be disposed of. Consequently, the amount of the polyimide film, which is relatively expensive, must be increased. By using the reinforcing frame in the form of a lead frame having relatively low cost, it is possible to minimize the amount of polyimide used.

With the surface where the circuit elements and electrode pad (4a) are formed facing up, semiconductor IC chip (4) is fixed on the surface of said substrate A where copper pattern (3) is formed. In order to fix chip (4) on substrate A, film (8) made from the same material as that for insulating base material (2), namely, thermoplastic polyimide resin, is formed on the inner surface of the chip. IC chip (4) is heated to a temperature higher than the glass transition temperature of the thermoplastic polyimide resin, so that film (8) made of thermoplastic polyimide resin and applied on the inner surface of the chip is melted, and it is pressed and bonded on insulating base material made of the thermoplastic polyimide resin. Then, as the temperature of the atmosphere is lowered, film (8) is bonded to copper pattern (3) and the surface of the base material in the gap of the copper pattern, so that semiconductor IC chip (4) is fixed to substrate A.

In the state with semiconductor IC chip (4) being carried, on the periphery of the chip on substrate A, bonding pattern (3a) of the copper pattern is exposed. By means of wire bonding between electrode pad (4a) on the principal surface of semiconductor IC chip (4) and its bonding pattern (3a), electrical connection between the chip and the copper pattern are formed. Molding resin (10) is formed on insulating substrate (2) such that it covers semiconductor IC chip (4) and a portion of the inner side of reinforcing frame (6) made of the lead frame.

Figure 4:
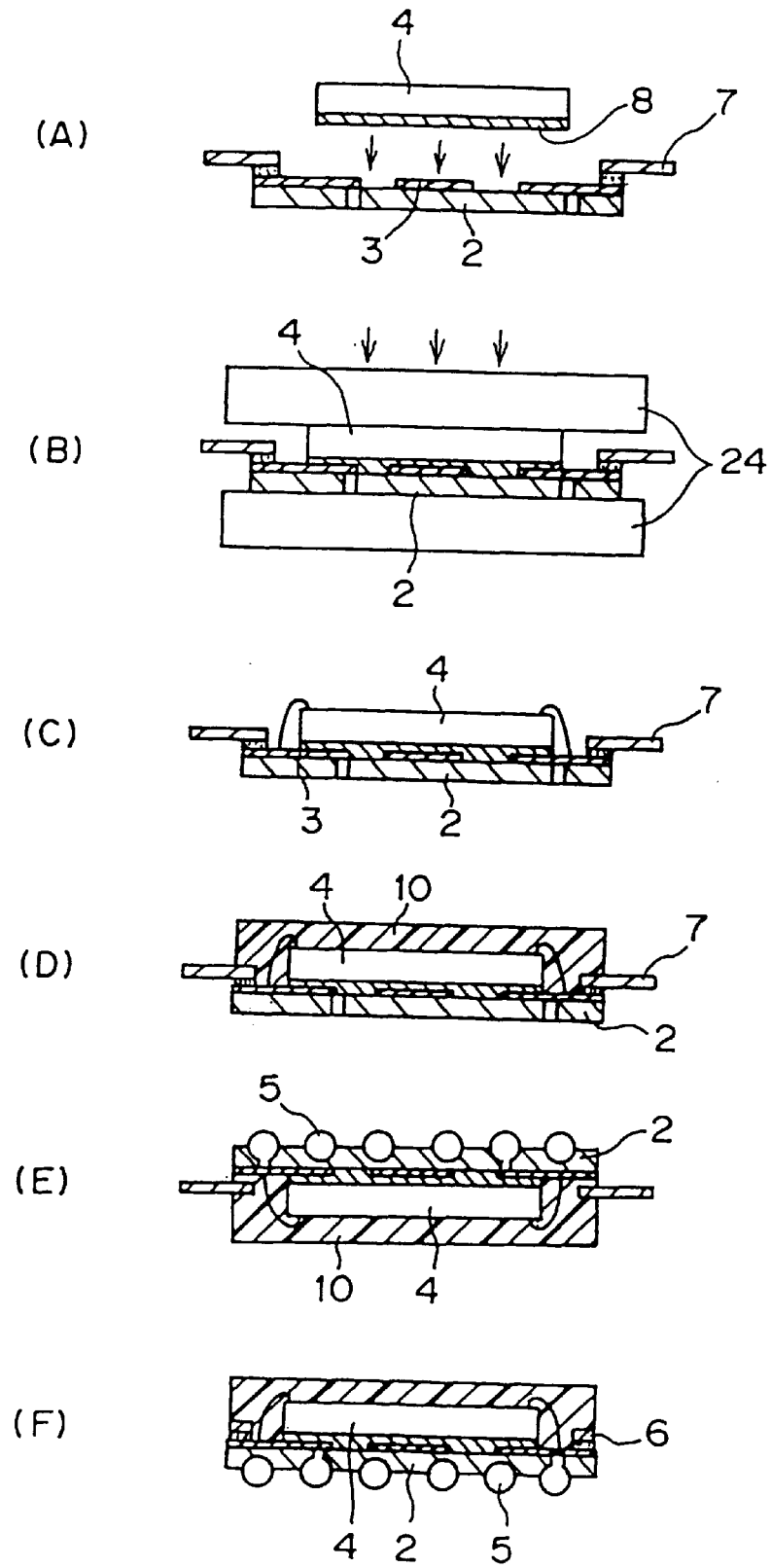
FIGS. 4(a) to 4(f) are diagrams illustrating the manufacturing operation of the semiconductor device in FIG. 1.

In the following, the manufacturing operation of said semiconductor device (1) will be explained for the various steps shown in FIG. 4. Film (8) of thermoplastic polyimide resin is formed on the inner surface of semiconductor IC chip (4), and the semiconductor IC chip is then set on substrate A fixed on lead frame (7) (step (A)). Film (8) may be formed by coating the liquid form of thermoplastic polyimide resin by the spin-coating method in the wafer state before dicing, or by mapping from a dicing tape (the method of transfer from the dicing tape described in Japanese Patent Application Nos. Hei 7[1995]-285323 and Hei 8[1996]-8049 may be used). By means of thermocompression bonding tool (24), substrate A and semiconductor IC chip (4) are held under a pressure of 0.5–2 kg, and thermocompression bonding is performed at a temperature in the range of 250–350° C. for 1–3 sec (step (B)). By means of heating, the thermoplastic polymide resin is melted at the interface between insulating base material 2 of substrate A and film 8, and the chip is bonded to the substrate.

Wire bonding is performed between copper pattern 3 and electrode pad 4a at a temperature in the range of 150–200° C. (step (C)). By means of transfer molding or potting, the chip is sealed with a resin (step (D)). When the resin flows in, lead frame 7 acts as a dam that prevents the resin from flowing out from the insulating substrate. Then, the package is inverted, and a squeegee is used to fill through-holes 2a with solder paste, followed by transfer of solder balls 5 (step (E)). By means of overall reflow, solder balls 5 are bonded to copper pattern 3. Finally, lead frame 7 projecting out from the package is cut off to form semiconductor device 1 (step (F)).

Figure 5:
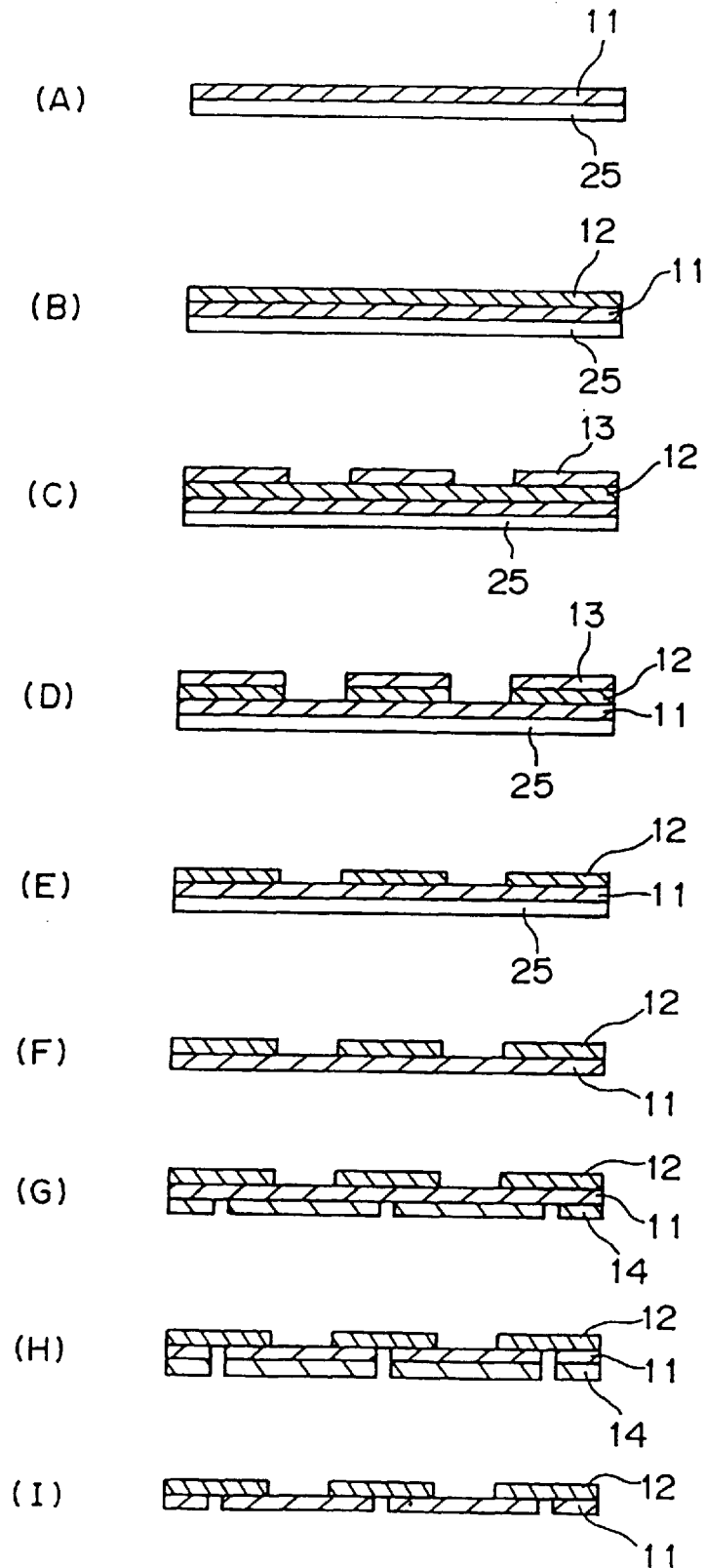
FIGS. 5(a) to 5(I) are diagrams illustrating the manufacturing process of the insulating substrate used in the semiconductor device shown in FIG. 1.

FIG. 5 illustrates the manufacturing operation of substrate A for use in said semiconductor device A. After the thermoplastic polyimide varnish is coated on heat-resistant film (25) as a base by means of screen printing or coating, the solvent is removed to form thermoplastic polyimide film (11) (step (A)). Copper foil (12) is then laminated on it (step (B)). After copper foil (12). is set on thermoplastic polyimide film (11), it is heated to about 300° C. Then, by means of roller pressing for bonding, this operating is completed. By means of lithography, resist 13 of epoxy resin, o-cresol, or acrylic resin is applied to form a pattern on copper foil 12 (step C)). Then, with said resist 13 used as a mask, copper foil 12 is etched with a solution of ferric chloride, etc., forming a copper pattern on polyimide film 11 (step (DSPs)). Resist 13 and heat-resistant film 25 are sequentially separated (steps (E) and (F)).

On the inner surface of thermoplastic polyimide film (11), resist (14) of epoxy resin, o-cresol, or acrylic resin is formed (step (G)). With resist (14) used as a mask, polyimide film (11) is etched by alkali or another chemical, forming through-holes (14) (step (H)). Then, resist (14) is separated from polyimide film (11). Finally, plating is applied on copper pattern (12), forming an insulating substrate (step (I)).

Several methods may be adopted to form the copper pattern on the aforementioned polyimide film, such as the method in which the copper pattern is deposited by sputtering, and the method in which the copper pattern is applied by plating. Also, the aforementioned through-holes may be formed by punching the polyimide film. This processing step should be carried out before the copper foil is laminated on the polyimide film. Before etching of the copper foil, back coating should be carried out for the through-holes.

The following properties are preferred for the thermoplastic polyimide resin used as the aforementioned insulating base material: glass transition temperature Tg in the range of 150–250° C.; dielectric constant in the range of 2.9–3.7, linear expansion coefficient in the range of 15–60 ppm° C., and tensile modulus in the range of 250–400 kg/mm$^2$.

Figure 12:
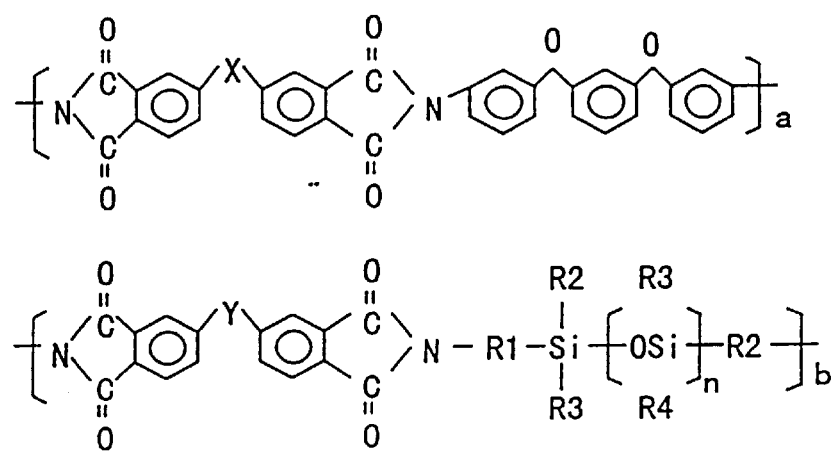
FIG. 12 illustrates a chemical composition of the thermoplastic polyimide resin used to form a flexible substrate, according to the present invention.

FIG. 12 illustrates a chemical composition of the thermoplastic polyimide resin used as the aforementioned insulating base material.

Figure 6:
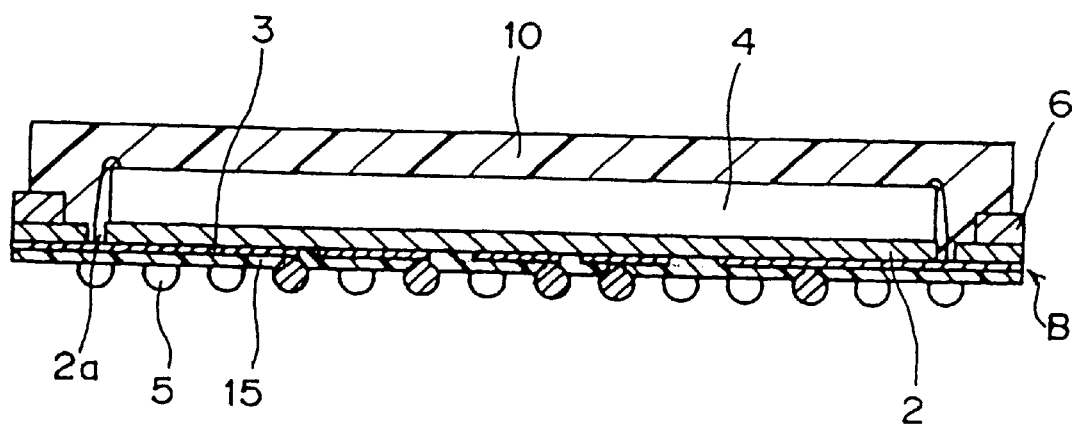
FIG. 6 is a cross-sectional view of the semiconductor device in the second embodiment of the present invention.

FIG. 6 is a cross-sectional view of the semiconductor device in a second embodiment of the present invention. It is a CSP package, in which the copper pattern of the substrate is arranged on the lower surface side of the package. If not specified otherwise, in the figures, the same part numbers as those in the aforementioned embodiment will be adopted to represent the same structural parts. Semiconductor device 1 has substrate B equipped with copper pattern 3 on the lower surface side of insulating base material 2 made of thermoplastic polyimide resin. In order to prevent copper pattern 3 from being exposed to the external atmosphere, for substrate B, except the region where solder balls 5 are carried, solder resist 15 is coated on the lower surface side of insulating base material 2.

Semiconductor IC chip (4) is carried on the side of surface of substrate B free of copper pattern (3), that is, on the side of the surface where thermoplastic polyimide is exposed over the entire region. For insulating base material (2) made of thermoplastic polyimide resin, a silicon chip (4) is bonded on its surface by thermal fusion. Consequently, there is no need to arrange a film of thermoplastic polyimide resin on the side of chip (4) as adopted in the preceding embodiment. Via through-holes (2a) formed on insulating base material (2), wire bonding is performed between copper pattern (3) and chip's electrode pad (4a).

On the periphery of substrate B, just as in the preceding embodiment, reinforcing frame (6) is also arranged. Also, reinforcing frame (6) is directly bonded on insulating base material (2) made of thermoplastic polyimide resin. IC chip (4) is sealed by means of molding resin (10).

Figure 7:
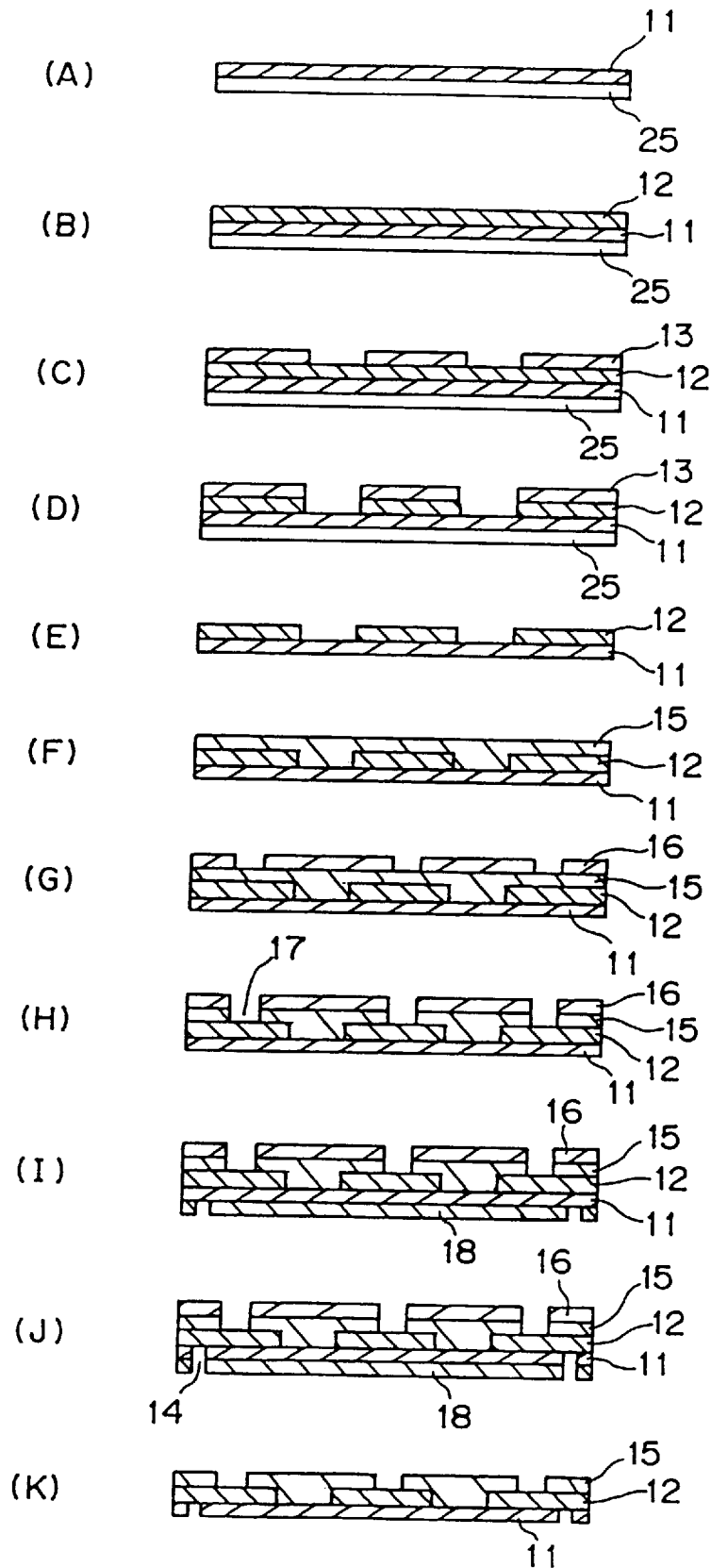
FIGS. 7(a) to 7(k) are diagrams illustrating the manufacturing process of the insulating substrate used in the semiconductor device shown in FIG. 6.

FIG. 7 is a diagram illustrating the manufacturing operation of the insulating substrate used in this embodiment. After a thermoplastic polyimide varnish is coated by screen printing or coating on heat-resistant film (25) as a base, the solvent is removed to form thermoplastic polyimide film (11) (step (A)). Copper foil (12) is laminated on it (step (B)). By means of lithography, resist (13) of epoxy resin, o-cresol, or acrylic resin is applied to form a pattern on copper foil (12) (step (B)). Then, with said resist (13) used as a mask, copper foil (12) is etched by a solution of ferric chloride, etc., forming a copper pattern on polyimide film (11) (step (D)). Resist (13) and heat-resistant film (25) are sequentially separated (step (E)).

Epoxy-based solder resist (15) is coated on copper pattern (12) (step (F)). In addition, resist (16) is formed on it by using o-cresol or acrylic resin (step (G)). With resist (16) used as a mask, solder resist (15) is etched, and through-holes (17) are formed for solder ball assembly (step (H)).

On the inner surface of thermoplastic polyimide film (11), resist (18) of epoxy resin, o-cresol, or acrylic resin is formed (step (I)). With resist (18) used as a mask, polyimide film (11) is etched with an alkali or another chemical, forming through-holes (14) (step (J)). Then, resists (16) and (18) are separated from polyimide film (11). Finally, plating is applied to copper pattern (12), forming substrate B (step (K)).

Figure 8:
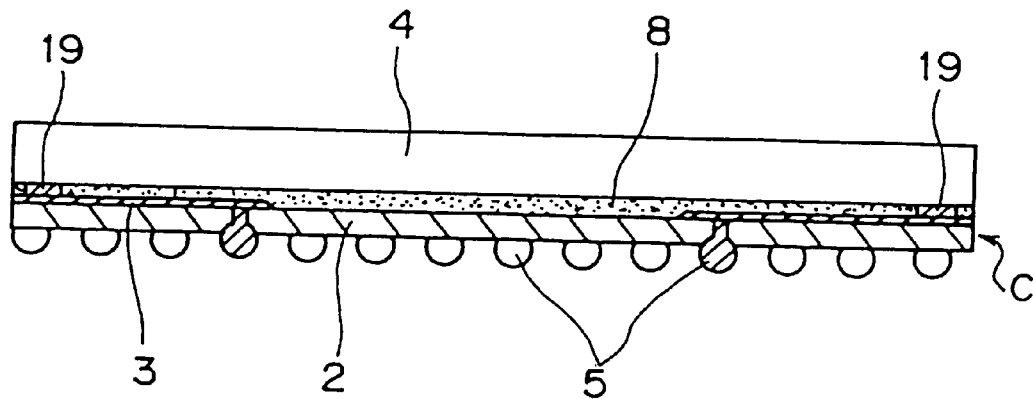
FIG. 8 is a cross-sectional view of the semiconductor device in the third embodiment of the present invention.

FIG. 8 is a cross-sectional view of the semiconductor device in a third embodiment of the present invention. It is a so-called flip-chip structure CSP package, in which the principal surface of the semiconductor IC chip is arranged facing the side of the substrate. If not specified otherwise, in the figures, the same part numbers as those in the aforementioned embodiment will be adopted to represent the same structural parts. On substrate C carrying semiconductor IC chip (4), insulating base material (2) made of thermoplastic polyimide resin has the same plane size as that of semiconductor IC chip (4) carried on the insulating base material. There is copper pattern (3) on the side of the surface of assembly of the chip. Solder balls (5) on the lower surface of the insulating base material are bonded with copper pattern (3) via through-holes (2a).

Figure 9:
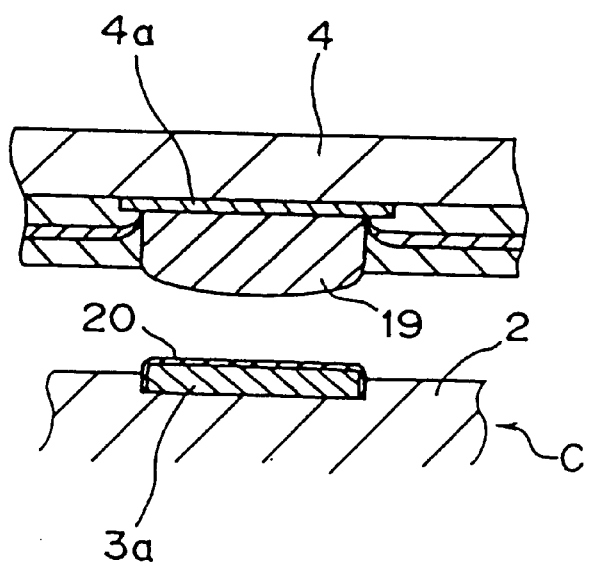
FIG. 9 is a diagram illustrating the corresponding relationship between the inner leads and the bumps before assembly of the chip in the semiconductor device shown in FIG. 8.

With its principal surface facing down, IC chip (4) is carried on substrate C. Before carrying of semiconductor IC chip (4), film (8) is formed from the thermoplastic polyimide resin on its principal surface, and by means of thermocompression bonding, chip (4) is bonded on the substrate. Electrode pad (4a) formed on the principal surface of the chip and inner leads of copper pattern (3) are bonded to each other through bumps (19) by means of an electroconductive polymer. Bumps (19) are formed on electrode pad (4a) of the chip before semiconductor IC chip (4) is carried on substrate C. FIG. 9 is a diagram illustrating the corresponding relationship between bonding pattern (3a) and bumps (19) before assembly of the chip. Also, the figure illustrates the state in which gold plating (20) is applied to bonding pattern (3a). Electroconductive bumps (19) can be made of thermoplastic polyimide resin blended with silver or another electroconductive filler, or a semireactive epoxy resin. When the chip is bonded to the insulating substrate by means of thermocompression bonding, the surface of bumps (19) is melted to bond with the bonding pattern.

Figure 10:
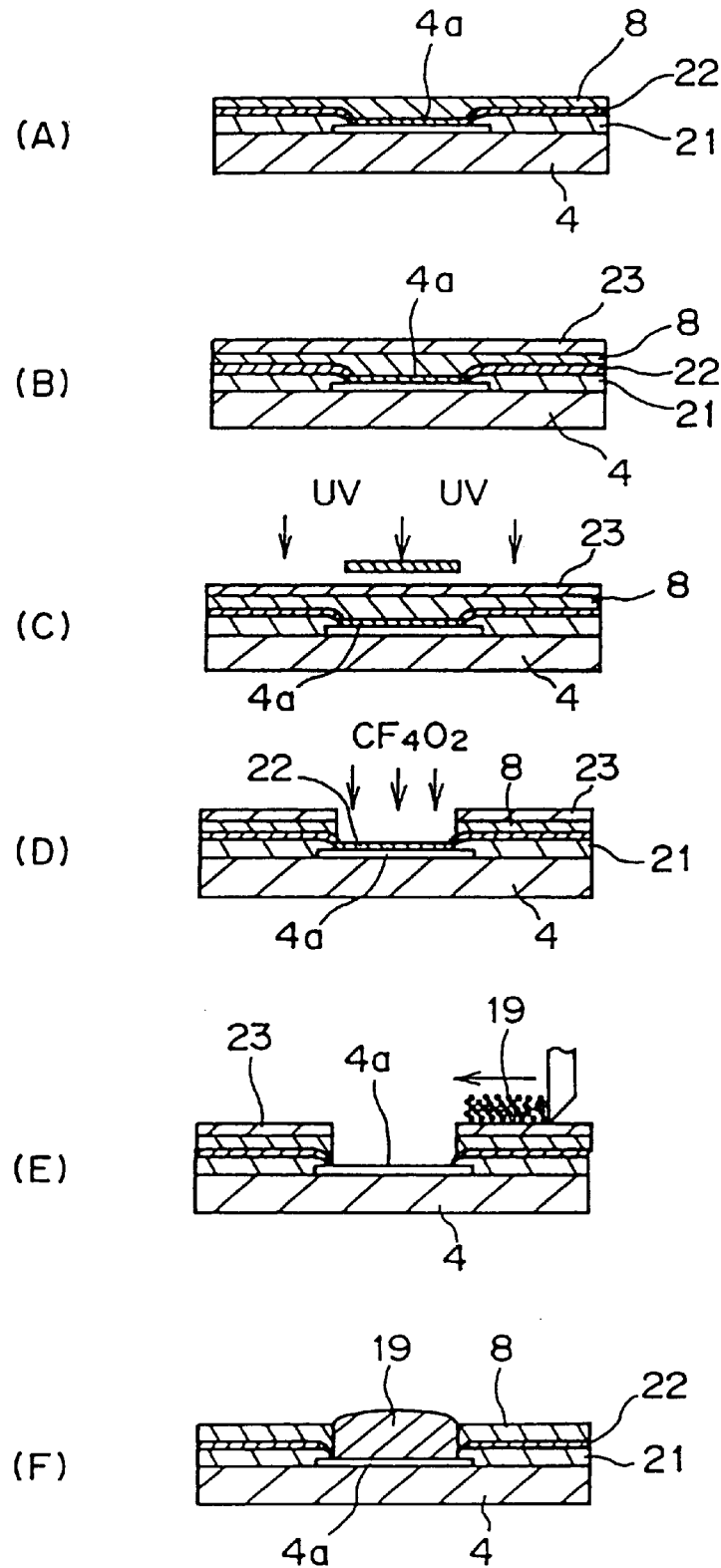
FIGS. 10(a) to 10(f) are diagrams illustrating the process of formation of bumps on the electrode pad in the semiconductor device shown in FIG. 8.
Figure 11:
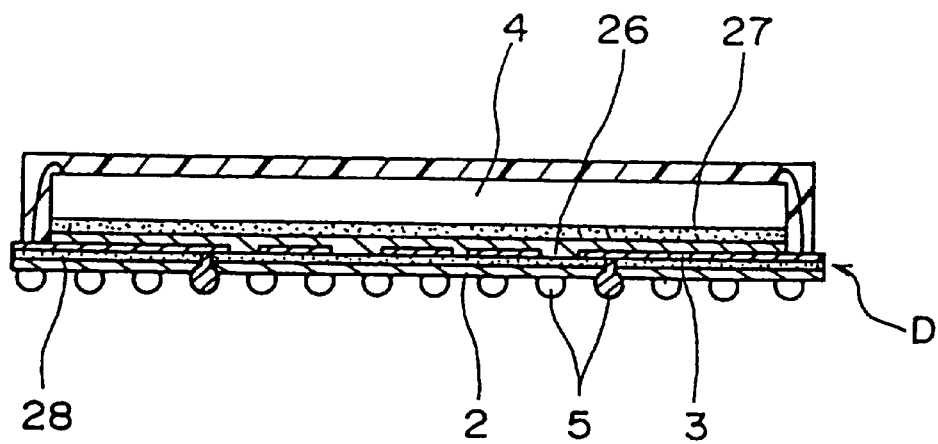
FIG. 11 is a cross-sectional view illustrating a conventional CSP type package.

FIG. 10 illustrates the process of formation of the aforementioned bumps on the electrode pad. Oxide film (21) and passivation film (22) made of silicon nitride are formed on the principal surface of semiconductor IC chip (4). Then, thermoplastic polyimide is coated on it, followed by heating and drying to form film (8) (step (A)). In this step, electrode pad (4a) is covered with passivation layer (22) and thermoplastic polyimide film (8). Epoxy-resin (23) is coated on film (8) (step (B)). Said resist (23) is masked for the sites corresponding to the electrode pad, and it is exposed for patterning (step (C)). The chip is immersed in a solvent to etch off polyimide on electrode pad (4a) with resist (23) as a mask (step (D)).

With resist (23) left there, dry etching is carried out to remove passivation layer (22) on electrode pad (4a) (step (E)). By means of screen printing or by means of a stencil, electroconductive polymer bumps (19) are formed on exposed electrode pad (4a). Finally, resist (23) is separated (steps (E) and (F)).

Several embodiments of the semiconductor device of the present invention have been explained above with reference to figures. However, the present invention is not limited to the aforementioned embodiments. In the aforementioned embodiments, the present invention is applied to the BGA type semiconductor devices with solder balls arranged in a two-dimensional configuration on the lower surface of the package. However, the present invention can also be applied to the package for which the solder ball bonding portion of the conductor pattern is positioned on the outer circumferential side of the substrate, and it is bonded to the leads extending from the side surface of the package. That is, in the present invention, the specific means for connecting the conductor pattern of the substrate to the external substrate is not important, and the present invention can be applied in packages of various forms. Also, the size of the substrate with respect to the plane size of the semiconductor IC chip is also not important for the present invention. Consequently, the present invention is not limited to the CSP type package used in the embodiment. It can also be used in other types of packages.

The insulating base material mainly made of the thermoplastic polyimide resin is itself adhesive. Consequently, when the semiconductor IC chip is fixed to the substrate, there is no need to make use of an epoxy-type die-attaching material. Consequently, the semiconductor device of the present invention has a high adhesion strength in the case of high-temperature reflow, and it is possible to realize good resistance to reflow cracks. Also, by using the aforementioned die-attaching material, it is possible to avoid the problem of separation of the semiconductor IC chip caused by the aforementioned die-attaching material that would take place in the conventional semiconductor device.

With the semiconductor device of the present invention, there is no need to coat an epoxy-type solder resist between the semiconductor IC chip and the conductor pattern of the substrate. Consequently, it is possible to prevent separation of the periphery of the package that takes place in the case of reflow as caused by the weak adhesion between the molding material for sealing the chip and the epoxy type solder resist. Also, it is possible to prevent the problem of substrate warpage caused by the difference in linear expansion coefficients of the insulating base material and the epoxy-type solder resist.

As the insulating base material mainly made of thermoplastic polyimide resin is itself adhesive, there is no need to have an adhesive layer for laminating the conductor pattern. Consequently, there is no need to arrange the curing step and the cleaning step that would be needed if there were an adhesive layer. That is, it is possible to reduce the number of the manufacturing steps of the package. Also, when a laminated substrate is manufactured, there is no need to use an adhesive between the multilayered substrate. Consequently, it is possible to reduce the manufacturing steps and to reduce the cost.

In the semiconductor device of the present invention, in which electrical connections were formed between the electrode pad and the conductor pattern on the insulating substrate by means of bumps mainly made of an electroconductive polymer, there is no need to arrange a complicated metal layer (such as Al—Cr—Cu—Ni—SnPb) as would be needed in the conventional structure to prevent metal diffusion. Also, there is no need to use lead or flux, and there is no need for a cleaning step. As a result, the manufacturing time of the semiconductor device can be shortened, and the cost reduced.

Also, since the difference between the linear expansion coefficient of the bumps mainly made of the electroconductive polymer and the film of thermoplastic polyimide resin for fixing the semiconductor IC chip on the substrate is small, there is less chance for poor contact caused by separation of the bumps from the conductor pattern.

What is claimed is:

1. A semiconductor device, comprising:
   a semiconductor IC chip,
   an insulating substrate equipped with a conductor pattern and having an insulating base material mainly made of a thermoplastic polyimide resin to which the semiconductor IC chip is fixed, wherein the thermoplastic polyimide resin has a glass transition temperature in the range of 150–250° C.,
   electrical connections between a plurality of electrode pads formed on a principal surface of the semiconductor IC chip and the conductor pattern, and
   connection means attached to the conductor pattern operable to form electrical connections between the conductor pattern and an external substrate.

2. The semiconductor device described in claim 1 wherein a surface opposite the principal surface of the semiconductor IC chip is bonded directly to the insulating base material of the insulating substrate without an intervening adhesive layer.

3. The semiconductor device described in claim 2 wherein the conductor pattern is arranged on a surface opposite the semiconductor IC chip carrying surface of the insulating base material of the insulating substrate, and
   wherein the electrical connections between the plurality of electrode pads of the semiconductor IC chip and the conductor pattern are realized via a plurality of through-holes formed on the insulating base material.

4. The semiconductor device described in claim 3 wherein the connection means are solder balls fixed on the conductor pattern.

5. A semiconductor device, comprising:
   a semiconductor IC chip,
   an insulating substrate equipped with a conductor pattern and having an insulating base material mainly made of a thermoplastic polyimide resin to which the semiconductor IC chip is fixed,
   electrical connections between a plurality of electrode pads formed on a principal surface of the semiconductor IC chip and the conductor pattern,
   connection means attached to the conductor pattern operable to form electrical connections between the conductor pattern and an external substratem and
   a film of the same material as the insulating base material of the insulating substrate between a surface of the semiconductor IC chip and a surface the insulating substrate, such that the semiconductor IC and the insulating substrate are bonded together by the film.

6. The semiconductor device described in claim 5 wherein the conductor pattern is arranged on the surface of the insulating substrate bonded to the film, and solder balls are fixed to the conductor pattern via a plurality of through-holes in the insulating base material.

7. The semiconductor device described in claim 1, further comprising a packaging material which seals the electrical connections between the plurality of electrode pads on the principal surface of the semiconductor IC chip and the conductor pattern.

8. The semiconductor device described in claim 5 wherein the film is bonded to the principal surface of the semiconductor IC, and wherein the electrical connections between the plurality of electrode pads of the semiconductor IC chip and the conductor pattern are bumps comprising an electroconductive polymer.

9. The semiconductor device described in claim 8 wherein the bumps of electroconductive polymer are a mixture of a thermoplastic polyimide resin and an electroconductive filler.

10. The semiconductor device described in claim 1 further comprising a reinforcing frame on the periphery of the insulating substrate.

11. The semiconductor device described in claim 10 wherein the reinforcing frame is a lead frame made of metal.

12. The semiconductor device described in claim 1, wherein the insulating substrate is a laminated substrate having conductor patterns among multiple layers mainly made of thermoplastic polyimide resin.

13. The semiconductor device of claim 1, wherein the thermoplastic polyimide resin has a linear expansion coefficient in the range of 15–60 ppm° C.

14. A semiconductor device, comprising:

a semiconductor IC chip, an insulating substrate equipped with a conductor pattern and having an insulating base material mainly made of a thermoplastic polyimide resin to which the semiconductor IC chip is fixed, wherein the thermoplastic polyimide resin has a glass transition temperature in the range of 150–250° C., and wherein the insulating substrate is bonded directly to the semiconductor IC chip via adhesive properties of the insulating base material without an intermediary adhesive material.

15. The semiconductive device of claim 14, wherein the insulating substrate comprises a plurality of layers of insulating base material mainly made of a thermoplastic polyimide resin with a corresponding plurality of conductor patterns bonded to each respective plurality of layers, and wherein the plurality of layers of the insulating substrate are bonded directly together via adhesive properties of the insulating base material without an intermediary adhesive material.

16. The semiconductor device of claim 5, wherein the thermoplastic polyimide resin has a glass transition temperature in the range of 150–250° C.

* * * * *